(12) United States Patent
Howard et al.

(10) Patent No.: US 6,830,982 B1
(45) Date of Patent: Dec. 14, 2004

(54) METHOD FOR REDUCING EXTRINSIC BASE RESISTANCE AND IMPROVING MANUFACTURABILITY IN AN NPN TRANSISTOR

(75) Inventors: David Howard, Irvine, CA (US); Marco Racanelli, Santa Ana, CA (US); Greg D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/290,976

(22) Filed: Nov. 7, 2002

(51) Int. Cl.$^7$ ................ H01L 21/331; H01L 21/8222
(52) U.S. Cl. ............... 438/320; 438/350; 438/365
(58) Field of Search .............. 438/312, 316–318, 438/320, 327, 339, 341, 350, 235, 365, 364, 315, 334; 257/197–198, 591, 592, 593, 187

(56) References Cited

U.S. PATENT DOCUMENTS

| | | | | |
|---|---|---|---|---|
| 5,126,278 A | * | 6/1992 | Kodaira ................ 438/350 |
| 5,289,020 A | * | 2/1994 | Hirose et al. ............ 257/197 |
| 5,583,059 A | * | 12/1996 | Burghartz ............... 438/319 |
| 5,681,763 A | * | 10/1997 | Ham et al. .............. 438/309 |
| 6,087,683 A | * | 7/2000 | King et al. .............. 257/183 |
| 6,221,783 B1 | * | 4/2001 | Park et al. .............. 438/712 |
| 6,265,275 B1 | * | 7/2001 | Marty et al. ............. 438/309 |
| 6,459,140 B1 | * | 10/2002 | Johansson et al. .......... 257/592 |
| 2003/0230789 A1 | * | 12/2003 | Beasom ................ 257/591 |

* cited by examiner

Primary Examiner—Shouxiang Hu
(74) Attorney, Agent, or Firm—Farjami & Farjami LLP

(57) ABSTRACT

According to one exemplary embodiment, an NPN bipolar transistor comprises a base layer situated over a collector, where the base layer comprises an intrinsic base region and an extrinsic base region. The NPN bipolar transistor may be, for example, an NPN silicon-germanium heterojunction bipolar transistor. The base layer can be, for example, silicon-germanium. According to this exemplary embodiment, the NPN bipolar transistor further comprises a cap layer situated over the base layer, where a portion of the cap layer is situated over the extrinsic base region, and where the portion of the cap layer situated over the extrinsic base region comprises an indium dopant. The cap layer may be, for example, polycrystalline silicon. According to this exemplary embodiment, the NPN bipolar transistor may further comprise an emitter situated over the intrinsic base region. The emitter may be, for example, polycrystalline silicon.

8 Claims, 5 Drawing Sheets

METHOD FOR REDUCING EXTRINSIC BASE RESISTANCE AND IMPROVING MANUFACTURABILITY IN AN NPN TRANSISTOR

BACKGROUND OF THE INVENTION

1. Field of the Invention

The present invention is in the field of fabrication of semiconductor devices. More specifically, the invention is in the field of fabrication of NPN transistors.

2. Related Art

In one type of bipolar transistor, and more particularly an NPN heterojunction bipolar transistor ("HBT"), used as an example in the present application, a thin silicon-germanium ("SiGe") layer is grown as the base of the bipolar transistor on a silicon wafer. The NPN SiGe HBT has significant advantages in speed, frequency response, and gain when compared to a conventional silicon bipolar transistor. Speed and frequency response can be compared by the cutoff frequency which, simply stated, is the frequency where the gain of a transistor is considerably reduced. Cutoff frequencies in excess of 100 GHz have been achieved for the NPN SiGe HBT, which are comparable to the more expensive GaAs. Previously, silicon-only devices have not been competitive for use where very high speed and frequency response are required.

The higher gain, speed and frequency response of the NPN SiGe HBT are possible due to certain advantages of silicon-germanium, such as a narrower band gap and reduced resistivity. These advantages make silicon-germanium devices more competitive than silicon-only devices in areas of technology where high speed and high frequency response are required. The advantages of high speed and high frequency response discussed above require, among other things, an NPN SiGe HBT having a thin base layer with low base resistance.

By way of background, in a typical NPN SiGe HBT, a P-type base layer is formed by depositing a P-type doped SiGe film on a silicon substrate. A cap layer is formed over the P-type base layer and doped with a P-type dopant, such as boron. An emitter is then formed on the cap layer and doped with an N-type dopant, such as arsenic. The emitter also defines an intrinsic base region of the base layer situated directly below the emitter and extrinsic base regions situated on either side of the intrinsic base region. The intrinsic base region of the NPN SiGe HBT is connected to external components or devices via base contacts formed on the extrinsic base regions of the base layer. In an effort to improve device performance by increasing speed and frequency response, semiconductor manufacturers have, among other things, attempted to reduce overall base resistance of the NPN SiGe HBT by reducing the resistance of the extrinsic base regions.

In a conventional attempt to reduce the resistance of the extrinsic base regions of the NPN SiGe HBT, semiconductor manufacturers typically implant the extrinsic base regions with a high concentration of boron, which is a P-type dopant that is activated by heat in an anneal process. It is desirable to have a high concentration of boron near the top surface of the extrinsic base regions to reduce base resistance without adding to the undesirable base to collector capacitance. However, boron has an undesirable tendency to easily diffuse when subjected to heat in an anneal process. The extension, perpendicular to the surface of the wafer, of the dopant profile in the diffusion process undesirably increases the base to collector capacitance.

Semiconductor manufacturers have attempted to reduce the diffusion of boron in the extrinsic base regions of the NPN SiGe HBT by greatly reducing the thermal budget after deposition of the base layer of the NPN SiGe HBT. However, NPN SiGe HBTs are often fabricated with metal oxide semiconductor ("MOS") transistors on the same substrate using Bipolar Complementary-Metal-Oxide-Semiconductor ("BiCMOS") technology. In a typical BiCMOS process, the NPN SiGe HBT needs to withstand a CMOS thermal budget required to activate dopants in the MOS devices. The CMOS thermal budget, for example, can include a high temperature, e.g. between approximately 900.0° C. and approximately 1050.0° C., rapid anneal for approximately 5 to 30 seconds. Thus, a large reduction in the thermal budget to accommodate the NPN SiGe HBT can have an undesirable effect on formation of MOS devices in a BiCMOS process.

Thus, there is a need in the art for reducing the extrinsic base resistance in an NPN bipolar transistor, such as an NPN SiGe HBT, without requiring a lower thermal budget or decreasing manufacturability of the NPN bipolar transistor.

SUMMARY OF THE INVENTION

The present invention is directed to method for reducing extrinsic base resistance and improving manufacturability in an NPN transistor and related structure. The present invention addresses and resolves the need in the art for reducing the extrinsic base resistance in an NPN bipolar transistor, such as an NPN SiGe HBT, without requiring a lower thermal budget or decreasing manufacturability of the NPN bipolar transistor.

According to one exemplary embodiment, an NPN bipolar transistor comprises a base layer situated over a collector, where the base layer comprises an intrinsic base region and an extrinsic base region. The NPN bipolar transistor may be, for example, an NPN silicon-germanium heterojunction bipolar transistor. The base layer can be, for example, silicon-germanium.

According to this exemplary embodiment, the NPN bipolar transistor further comprises a cap layer situated over the base layer, where a portion of the cap layer is situated over the extrinsic base region, and where the portion of the cap layer situated over the extrinsic base region comprises an indium dopant. The cap layer may be, for example, polycrystalline silicon and may have a thickness less than 100.0 Angstroms. The indium dopant may extend to, for example, a depth of between approximately 10.0 Angstroms and approximately 100.0 Angstroms in the portion of the cap layer situated over the extrinsic base region.

According to this exemplary embodiment, the NPN bipolar transistor may further comprise an emitter situated over the intrinsic base region. The emitter may be, for example, polycrystalline silicon. In another embodiment, the present invention is a method that achieves the above-described NPN bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to method for reducing extrinsic base resistance and improving manufacturability in an NPN transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
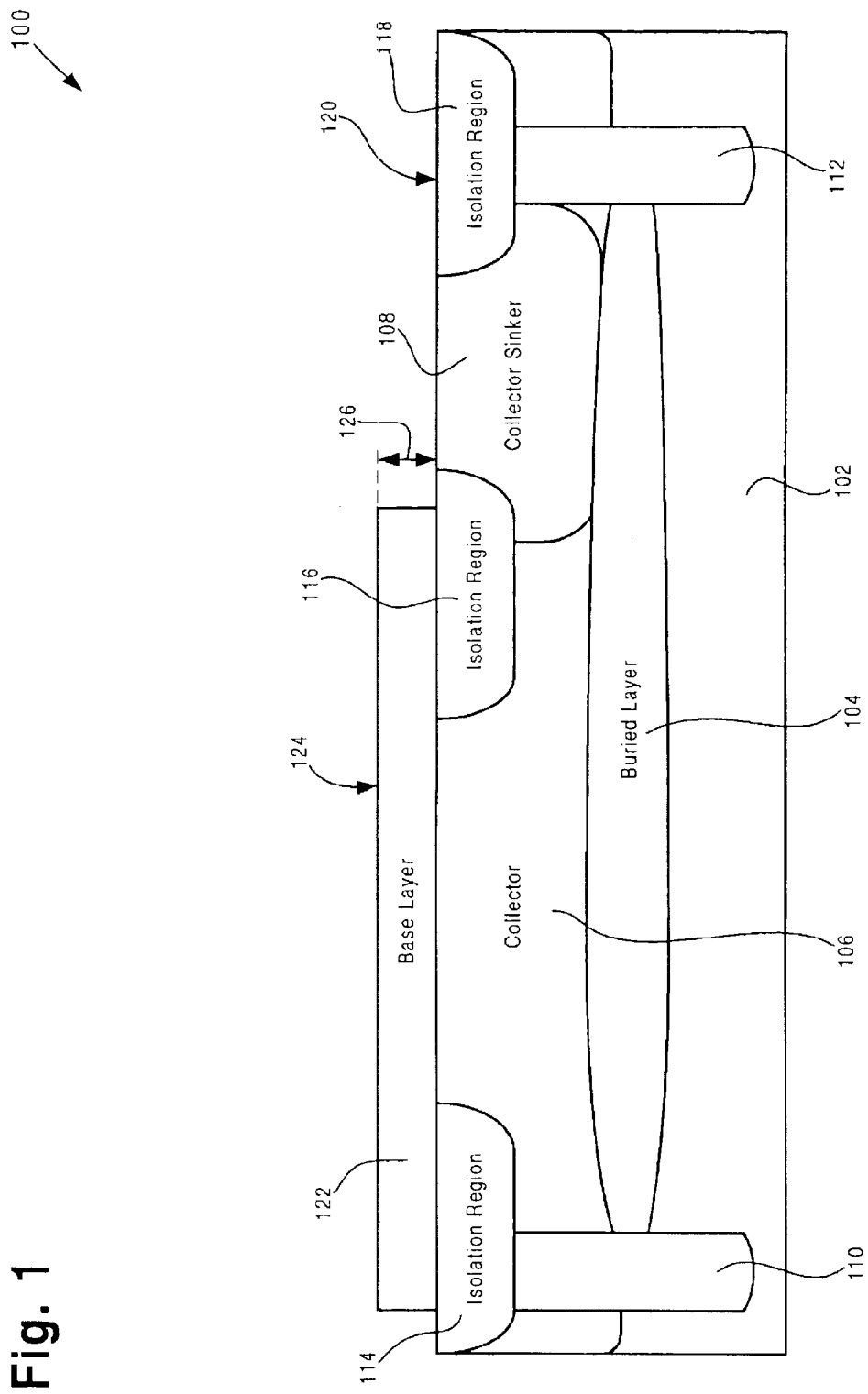
FIG. 1 illustrates a cross-sectional view of some of the features of an exemplary NPN bipolar transistor prior to application of the steps taken to implement an embodiment of the present invention.

FIG. 1 shows a cross-sectional view of structure 100, which is utilized to describe one embodiment of the present invention. Certain details and features have been left out of FIG. 1 that are apparent to a person of ordinary skill in the art. Although an exemplary NPN SiGe HBT is described in the present embodiment, other bipolar transistors may be fabricated according to the present invention. Structure 100 includes collector 106 and base layer 122. In the present embodiment, collector 106 is N-type single crystal silicon that can be formed using a dopant diffusion process in a manner known in the art.

As shown in FIG. 1, base layer 122 is situated over collector 106 on top surface 120 of silicon substrate 102, resulting in a collector-base junction at the interface of base layer 122 and collector 106. In the present embodiment, base layer 122 can be fabricated by epitaxial deposition of a SiGe film utilizing, for example, a vapor phase epitaxy ("VPE") process, on collector 106 and isolation regions 114 and 116. As a result, base layer 122 comprises SiGe single crystal over collector 106 and polycrystalline SiGe over isolation regions 114 and 116. In one embodiment, base layer 122 may be implanted or grown in-situ with boron ions to achieve P-type doping. In the present embodiment, thickness 126 of base layer 122 can be between approximately 100.0 Angstroms and approximately 500.0 Angstroms.

Also shown in FIG. 1, buried layer 104, which comprises N+ type material, i.e. heavily doped N-type material, is formed in silicon substrate 102 in a manner known in the art. Collector sinker 108, which also comprises N+ type material, is formed by diffusion of heavily concentrated dopants from the surface of collector sinker 108 down to buried layer 104. Buried layer 104, along with collector sinker 108, provide a low resistance electrical pathway from collector 106 through buried layer 104 and collector sinker 108 to a collector contact (the collector contact is not shown in FIG. 1).

As further shown in FIG. 1, deep trench structures 110 and 112 and isolation regions 114, 116, and 118 provide electrical isolation from other devices on silicon substrate 102. Deep trenches 110 and 112 and isolation regions 114, 116, and 118 can comprise silicon dioxide and are formed in a manner known in the art. Although isolation regions 114, 116, and 118 comprise silicon dioxide in the present embodiment, a person skilled in the art will recognize that other materials may be used, such as silicon nitride, a low-k dielectric, or other suitable dielectric material. Isolation regions 114, 116, and 118 may also be field oxide regions, shallow trench isolation oxide ("STI") regions, or local oxidation of silicon, generally referred to as "LOCOS."

Figure 2:
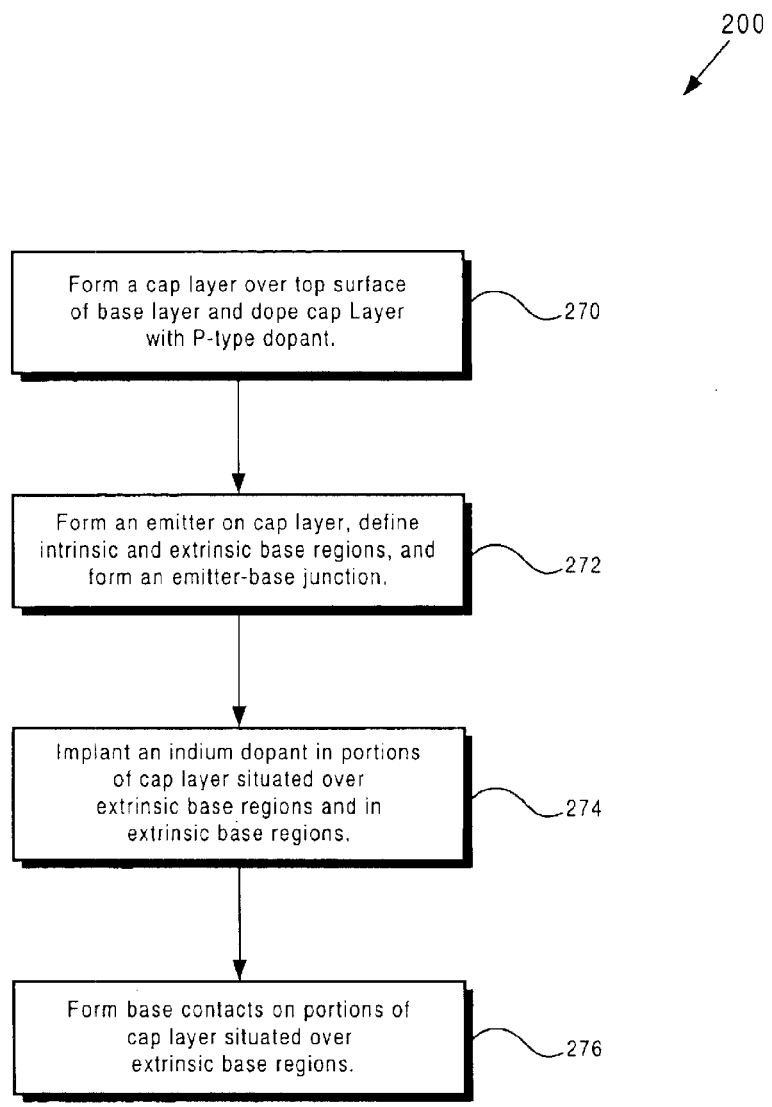
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art. Steps 270 through 276 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 270, includes structure 100 shown in FIG. 1.

Figure 3A:
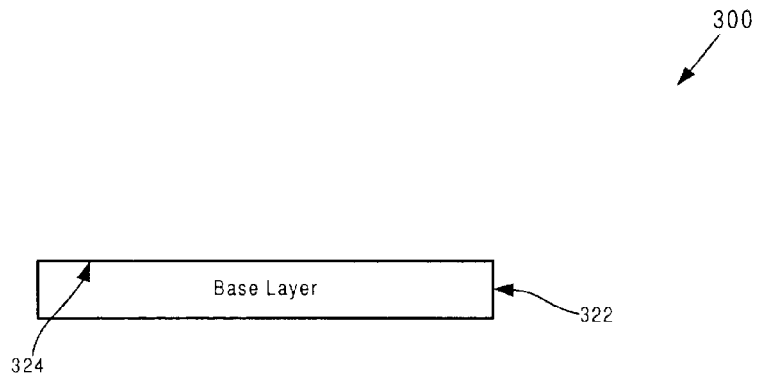
FIG. 3A illustrates a cross sectional view of an exemplary structure corresponding to a portion of the exemplary NPN transistor of FIG. 1 prior to performance of the steps shown in the flowchart of FIG. 2.
Figure 3B:
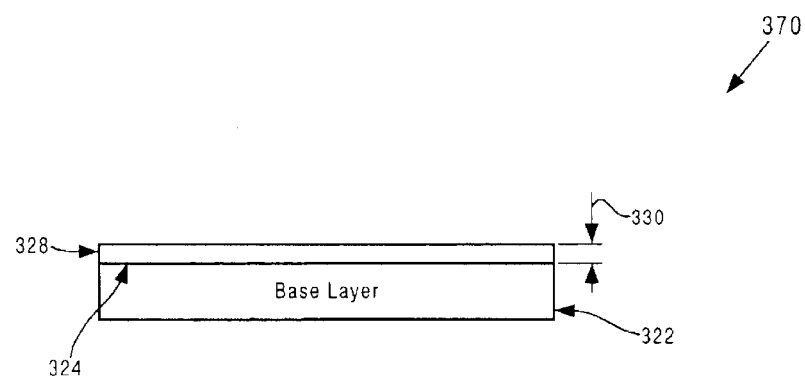
FIG. 3B illustrates a cross sectional view of an exemplary structure after performance of step 270 of FIG. 2, in accordance with one embodiment of the present invention.

Referring now to FIG. 3A, structure 300 of FIG. 3A shows a portion of structure 100 of FIG. 1. Base layer 122 and top surface 124 of structure 100 are shown in structure 300 as base layer 322 and top surface 324, respectively. For simplicity, other features, such as silicon substrate 102, buried layer 104, collector 106, collector sinker 108, deep trenches 110 and 112, isolation regions 114, 116, and 118, and top surface 120 are not shown in structure 300. Structure 300 thus shows the portion of a wafer including top surface 324 of base 322, before processing the wafer according to one embodiment of the invention shown in flowchart 200 of FIG. 2. In particular, structure 300 shows a portion of the wafer before processing step 270 of flowchart 200.

Referring to FIGS. 3A, 3B, 3C, 3D, and 3E, structures 370, 372, 374, and 376 illustrate the result of performing, on structure 300, steps 270, 272, 274, and 276 of flowchart 200 of FIG. 2, respectively. For example, structure 370 shows structure 300 after processing step 270, structure 372 shows structure 370 after the processing of step 272, and so forth.

Continuing with step 270 in FIG. 2 and structure 370 in FIG. 3A, step 270 of flowchart 200 comprises the formation of cap layer 328 over top surface 324 of base layer 322 and doping of cap layer 328. In the present embodiment, cap layer 328 might comprise single crystal or polycrystalline silicon, which may be deposited and patterned on top surface 324 of base layer 322 in a manner known in the art. However, cap layer 328 may also comprise other materials, such as silicon-germanium or other suitable material as known in the art. In the present embodiment, thickness 330 of cap layer 328 can be approximately 100.0 Angstroms. In one embodiment, thickness 330 of cap layer 328 may be less than 100.0 Angstroms. Cap layer 328 is then doped with a medium to high concentration of a P-type dopant, such as boron or other P-type dopant as known in the art. The thickness, i.e. thickness 330, of cap layer 328 and doping concentration level in cap layer 328, among other things, determine the operating speed as well as manufacturability of the NPN SiGe HBT that includes cap layer 328 and base layer 322. For example, the operating speed of the NPN SiGe HBT that includes cap layer 328 can be increased by making cap layer 328 thinner. By way of further example, increasing the thickness, i.e. thickness 330, of cap layer 328 increases the manufacturability of the NPN SiGe HBT, while increasing the doping concentration level in cap layer 328 causes the NPN SiGe HBT to be more difficult to manufacture. The result of step 270 of flowchart 200 is illustrated by structure 370 in FIG. 3B.

Figure 3C:
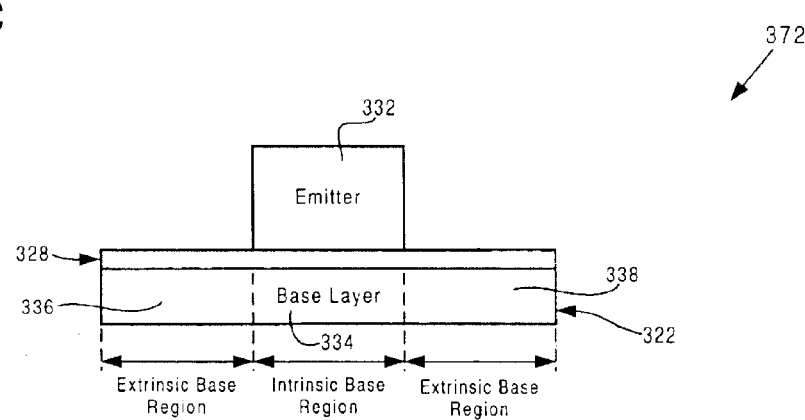
FIG. 3C illustrates a cross sectional view of an exemplary structure after performance of step 272 of FIG. 2, in accordance with one embodiment of the present invention.

Referring to step 272 in FIG. 2 and structure 372 in FIG. 3C, at step 272 of flowchart 200, emitter 332 is formed on cap layer 328. In the present embodiment, emitter 332 can comprise N-type polycrystalline silicon and may be formed, for example, by depositing, patterning, etching, and doping a layer of polycrystalline silicon with an N-type dopant, such as arsenic, in a manner known in the art. In one embodiment, emitter 332 may comprise amorphous silicon, which may be doped with an appropriate N-type dopant. Emitter 332 defines intrinsic base region 334, which is a portion of base layer 322 that is situated directly below emitter 332, and extrinsic base regions 336 and 338, which comprise portions of base layer 322 situated adjacent to the sides of intrinsic base region 334.

Intrinsic base region 334 forms the base of the NPN SiGe HBT that includes emitter 332. As discussed above, emitter 332 is doped with an N-type dopant and cap layer 328, which is situated between intrinsic base region 334 and emitter 332, is doped with a P-type dopant. By application of heat to structure 372, the N-type dopant in emitter 332 and the P-type dopant in cap layer 328 diffuses into intrinsic base region 334, resulting in formation of an emitter-base junction. The emitter-base junction may be formed by heat applied in an annealing process as known in the art. The result of step 272 of flowchart 200 is illustrated by structure 372 in FIG. 3C.

Figure 3D:
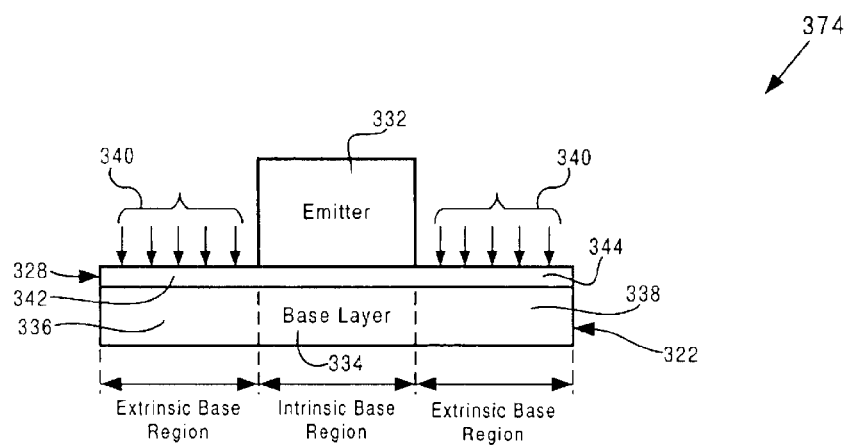
FIG. 3D illustrates a cross sectional view of an exemplary structure after performance of step 274 of FIG. 2, in accordance with one embodiment of the present invention.

Referring to step 274 in FIG. 2 and structure 374 in FIG. 3D, at step 274 of flowchart 200, an indium dopant is implanted in cap layer portions 342 and 344, which are situated over extrinsic base regions 336 and 338, respectively. In the present embodiment, the indium dopant is implanted in cap layer portions 342 and 344 via indium implant 340. In the present embodiment, indium implant 340 can be performed at zero "tilt." By way of background, "tilt" refers to the direction in which the implant atoms strike the surface of the wafer. For example, at zero "tilt" the implant atoms strike the wafer perpendicular to its surface. By way of further example, at non-zero "tilt" the implant atoms strike the wafer at an angle that is less than 90.0 degrees relative to the surface of the wafer. In one embodiment, indium implant 340 can be performed at a non-zero "tilt." In the present embodiment, indium implant 340 can be performed by an implanter operating at an energy level of between approximately 0.1 kilo-electron Volt ("keV") and approximately 10.0 keV. In one embodiment, an indium dopant may be introduced into cap layer portions 342 and 344 by a vapor phase doping process.

As a result of indium implant 340, some indium atoms will penetrate cap layer portions 342 and 344 and enter extrinsic base regions 336 and 338, respectively. The quantity of indium atoms that are implanted in extrinsic base regions 336 and 338 is determined by the dose of implanted ions, and the depth profile of dopant atoms is determined by the implanter energy level utilized to perform indium implant 340. As a result of implanting indium atoms in cap layer portions 342 and 344 and extrinsic base regions 336 and 338, the resistance of cap layer portions 342 and 344 and extrinsic base regions 336 and 338 is reduced. The result of step 274 of flowchart 200 is illustrated by structure 374 in FIG. 3D.

Figure 3E:
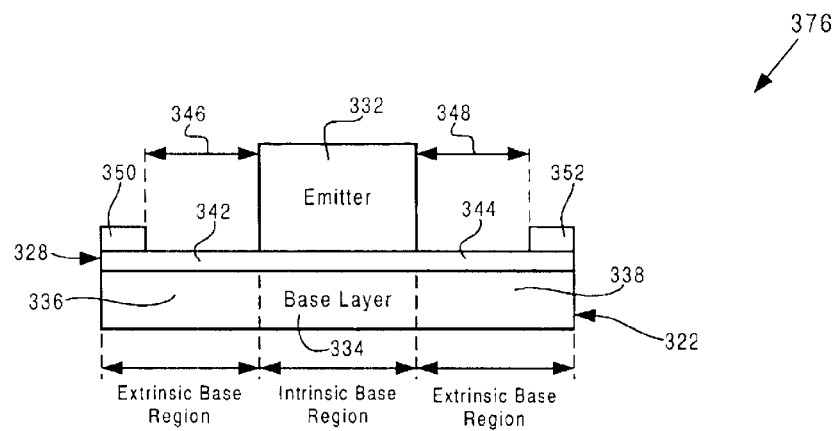
FIG. 3E illustrates a cross sectional view of an exemplary structure after performance of step 276 of FIG. 2, in accordance with one embodiment of the present invention.

Referring to step 276 in FIG. 2 and structure 376 in FIG. 3E, at step 276 of flowchart 200, base contacts 350 and 352 are formed on cap layer portions 342 and 344, respectively. Base contacts 350 and 352 provide electrical connections to intrinsic base region 334 via cap layer portions 342 and 344 and extrinsic base regions 336 and 338, respectively. Base contacts 350 and 352 are situated at distances 346 and 348, respectively, from emitter 332. The result of step 276 of flowchart 200 is illustrated by structure 376 in FIG. 3E.

As discussed above, the present invention utilizes indium atoms, e.g. in indium implant 340 in FIG. 3D, which are significantly larger than boron atoms utilized in a conventional boron implant. As a result, the present invention achieves greater depth control by utilizing an indium implant in comparison to a conventional boron implant, since the much smaller boron atoms diffuse deeper into the cap layer portions and extrinsic base regions of an NPN transistor than the larger indium atoms. Also, by utilizing an indium implant, the present invention achieves greater control in diffusion in a direction parallel to the surface of the wafer in comparison to a conventional boron implant, since the larger indium atoms diff use much slower than the smaller boron atoms. Thus, as further discussed below, by achieving greater diffusion control in directions both perpendicular to and in parallel with the surface of the wafer, the present invention advantageously achieves an NPN transistor having increased manufacturability than an NPN transistor utilizing a conventional boron implant.

Moreover, by utilizing indium atoms that diffuse much slower than boron atoms, the present invention advantageously decouples the CMOS and bipolar process dependencies to permit independent CMOS and bipolar device design. The reason is that the large indium atoms diffuse much slower than smaller boron atoms, and as such the present invention can utilize a greater concentration of indium atoms in extrinsic base regions of an NPN transistor compared to a concentration of boron atoms that can be feasibly utilized in extrinsic base regions of an NPN transistor utilizing a conventional boron implant. As a result, the present invention's NPN transistor advantageously achieves a lower extrinsic base resistance while preventing the diffusion of the P-type dopants too deep into the extrinsic and intrinsic base regions during subsequent high temperature BiCMOS processes. Consequently the invention achieves reduced base resistance compared to an NPN transistor utilizing a conventional boron implant to dope extrinsic base regions while the invention's NPN transistor can be more easily integrated on the same wafer with CMOS devices utilizing BiCMOS technology.

Further, by utilizing an indium implant, the present invention advantageously achieves an NPN transistor that can be more effectively scaled down in size laterally or parallel to the wafer surface to provide a desirable narrower emitter dimension. Analogous to the benefits of perpendicular dopant profile control, the larger indium atoms will remain in correspondingly thinner extrinsic base regions in much greater concentrations than lighter boron atoms, which diffuse easily, and undesirably, into the intrinsic base region. The lower diffusion rate of indium also results in improved control in connecting the intrinsic and extrinsic base regions since the lateral diffusion of indium is easier to control.

In addition, the present invention can utilize less expensive implanter tools that utilize implant energy levels above approximately 3.0 keV to accurately implant indium atoms, whereas conventional boron implants typically require more expensive tools that provide low implant energy levels of between approximately 1.0 keV and approximately 3.0 keV to accurately implant boron atoms in extrinsic base regions of an NPN transistor.

Figure 4:
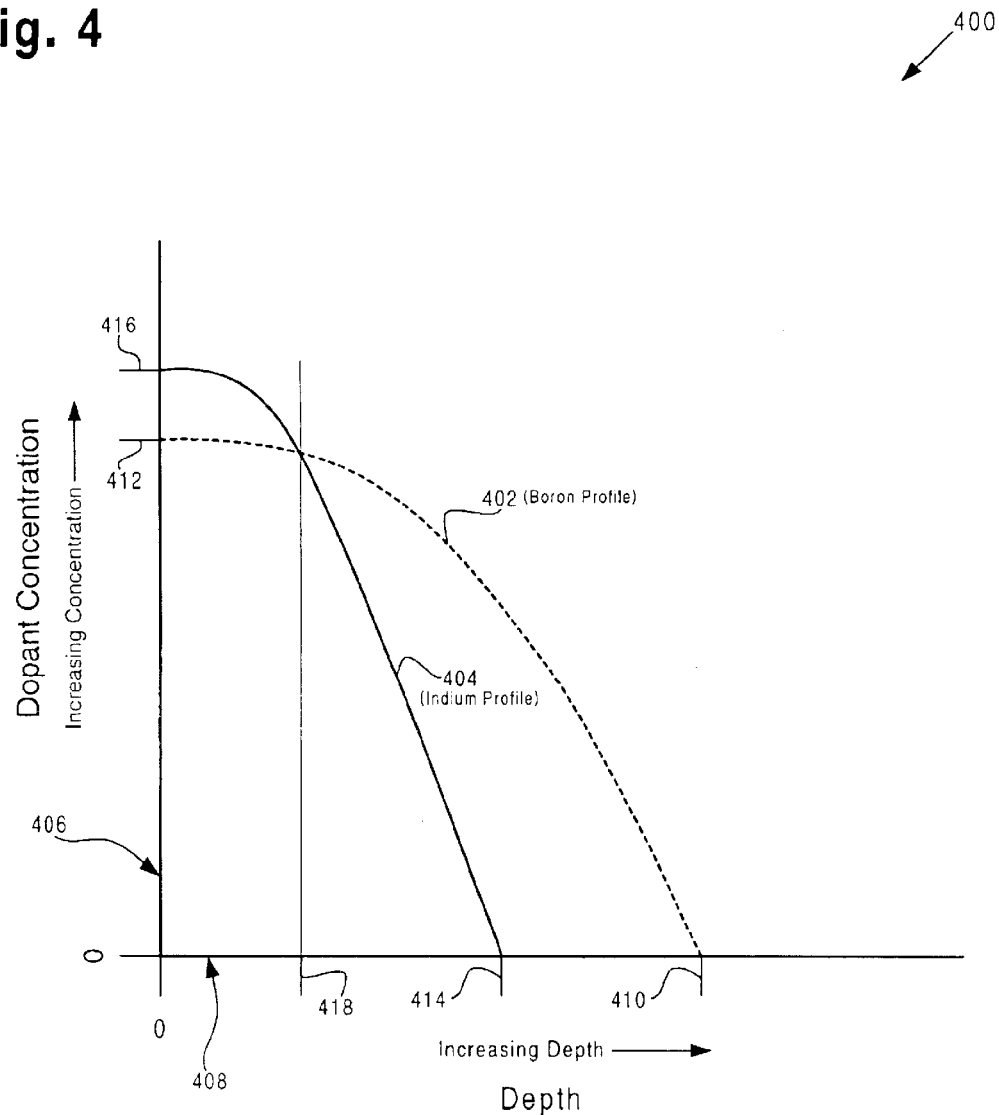
FIG. 4 is a graph showing a convention exemplary boron profile and an exemplary indium profile in a portion of a cap layer over an extrinsic base region of an exemplary NPN transistor, in accordance with one embodiment of the present invention.

Graph 400 in FIG. 4 shows a conventional exemplary boron profile and an exemplary indium profile in accordance with one embodiment of the present invention. In particular, conventional boron profile 402 and indium profile 404 in graph 400 show a conventional boron profile and an indium profile, respectively, in an extrinsic base region of an NPN SiGe HBT, such as extrinsic base region 338 in FIG. 3E, at an implant energy of approximately 2.0 keV. Graph 400 includes concentration level axis 406 plotted against depth axis 408. Concentration level axis 406 shows relative concentration levels of boron and indium, respectively, in conventional boron profile 402 and indium profile 404. Depth axis 408 shows increasing depth in a cap layer and an extrinsic base region, such as cap layer portion 344 and extrinsic base region 338 in FIG. 3E, starting at the top surface of cap layer portion 344. Thus, "0" on depth axis 408 indicates the top surface of cap layer portion 344.

Continuing with graph 400, conventional boron profile 402 begins at depth 0.0, i.e. the top of a cap layer portion, such as cap layer portion 344 in FIG. 3E, and ends at depth 410. Depth 410 can be between approximately 10.0 Angstroms and approximately 200.0 Angstroms. The boron concentration level starts at boron concentration level 412 at depth 0.0 and decreases to boron concentration level 0.0 at depth 410. Also shown in graph 400, indium profile 404 begins at depth 0.0 and ends at depth 414. In the present embodiment, depth 414 can be between approximately 10.0 Angstroms and approximately 100.0 Angstroms. The indium concentration level starts at indium concentration level 416 at depth 0.0 and decreases to indium concentration level 0.0 at depth 414.

Continuing with graph 400, conventional boron profile 402 intersects with indium profile 404 at depth 418. Since, as shown in graph 400, indium concentration level 416 is greater than boron concentration level 412, the indium concentration between depth 0.0 and depth 418 is greater than the boron concentration between depth 0.0 and depth 418. As a result, resistance of a cap layer, such as cap layer 344 in FIG. 3E, between depth 0.0 and depth 418 is lower for indium doping than for boron doping at the same implant energy of approximately 2.0 keV. For example, by utilizing an indium implant, the present invention achieves a resistance decrease in a cap layer, such as cap layer 344, of at least 10.0% compared to the resistance of the cap layer implanted with a conventional boron implant. Furthermore, as shown in graph 400, indium profile 404 shows that indium atoms do not penetrate as deeply into the cap layer and extrinsic base region as do the boron atoms, since depth 414, i.e. the depth at which indium profile 404 reaches 0.0 concentration level, is less than depth 410, i.e. the depth at which conventional boron profile 402 reaches 0.0 concentration level.

Thus, as illustrated in graph 400, since indium profile 404 is less extended than boron profile 402, the present invention advantageously achieves greater depth control by utilizing an indium implant compared to the depth control achieved by a conventional boron implant. As a result, the present invention can provide an increased concentration of indium atoms near the surface of the cap layer portions, such as cap layer portions 342 and 344, which advantageously reduces the extrinsic base resistance without comprising the base to collector capacitance.

It is appreciated by the above detailed description that the invention achieves reduced extrinsic base resistance and increased manufacturability. From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, the principles of the present invention are also applicable to NPN HBTs using a base layer comprising a material other than SiGe, such as SiGeC ("SiGe-Carbon"). As such, the described embodiments are to be considered in all respects as illustrative and not restrictive. It should also be understood that the invention is not limited to the particular embodiments described herein, but is capable of many rearrangements, modifications, and substitutions without departing from the scope of the invention. For example, the specified layouts, dimensions, and doping levels are provided solely for the purpose of illustrating the present invention by way of a specific example and such dimensions, layouts, and doping levels can be manifestly varied without departing from the scope of the present invention.

Thus, method for reducing extrinsic base resistance and improving manufacturability in an NPN transistor and related structure have been described.

What is claimed is:

1. A method for fabricating an NPN bipolar transistor, said method comprising steps of:

forming a base layer over a collector;

forming a cap layer over said base layer;

fabricating an emitter over said cap layer, said emitter defining an intrinsic base region and an extrinsic base region of said base layer:

implanting an indium dopant in said cap layer over said extrinsic base region of said base layer after said step of forming said base layer and after fabricating said emitter.

2. The method of claim 1 wherein said indium dopant is implanted at an energy level of between approximately 0.1 keV and approximately 10.0 keV.

3. The method of claim 1 wherein said NPN bipolar transistor is an NPN silicon-germanium heterojunction bipolar transistor.

4. The method of claim 1 wherein said cap layer comprises polycrystalline silicon.

5. The method of claim 1 wherein said base layer comprises silicon-germanium.

6. The method of claim 1 wherein said emitter comprises polycrystalline silicon.

7. The method of claim 1 wherein a thickness of said base layer is between approximately 100.0 Angstroms and 500.0 Angstroms.

8. The method of claim 1 wherein a thickness of said cap layer is less than 100.0 Angstroms.

\* \* \* \* \*